(12) United States Patent
Hsiao et al.

(10) Patent No.: US 11,289,840 B2
(45) Date of Patent: Mar. 29, 2022

(54) CABLE END CONNECTOR

(71) Applicant: BIZLINK INTERNATIONAL CORPORATION, New Taipei (TW)

(72) Inventors: Hsin Tuan Hsiao, New Taipei (TW); Chih-Feng Cheng, New Taipei (TW); Jui Hung Chien, New Taipei (TW)

(73) Assignee: BIZLINK INTERNATIONAL CORPORATION, New Taipei (TW)

( * ) Notice: Subject to any disclaimer, the term of this patent is extended or adjusted under 35 U.S.C. 154(b) by 0 days.

(21) Appl. No.: 17/021,021

(22) Filed: Sep. 15, 2020

(65) Prior Publication Data
US 2021/0175650 A1   Jun. 10, 2021

(30) Foreign Application Priority Data
Dec. 6, 2019   (TW) .................................. 108216281

(51) Int. Cl.
*H01R 13/6471* (2011.01)
*H01R 12/77* (2011.01)
*H05K 1/11* (2006.01)
*H01R 13/627* (2006.01)

(52) U.S. Cl.
CPC ......... *H01R 12/771* (2013.01); *H01R 12/777* (2013.01); *H05K 1/117* (2013.01); *H01R 13/6272* (2013.01); *H05K 2201/09154* (2013.01)

(58) Field of Classification Search
CPC ..... H01R 12/771; H01R 12/777; H05K 1/117
See application file for complete search history.

(56) References Cited

U.S. PATENT DOCUMENTS

| | | | | |
|---|---|---|---|---|
| 3,432,795 A | * | 3/1969 | Jayne ................... | H01R 13/631 439/60 |
| 3,518,612 A | * | 6/1970 | Axford .................. | H01R 12/88 439/507 |
| 4,464,832 A | * | 8/1984 | Asick ..................... | H05K 3/202 29/839 |
| 4,572,604 A | * | 2/1986 | Ammon ............... | H01R 12/725 439/633 |
| 4,806,103 A | * | 2/1989 | Kniese ................... | H05K 1/117 439/60 |
| 4,849,944 A | * | 7/1989 | Matsushita ........... | G11C 5/143 714/718 |
| 5,024,609 A | * | 6/1991 | Piorunneck .......... | H01R 12/721 439/60 |

(Continued)

*Primary Examiner* — Neil Abrams
(74) *Attorney, Agent, or Firm* — Rabin & Berdo, P.C.

(57) ABSTRACT

A connector has a casing and a circuit board structure. The circuit board structure is mounted through the casing and has a board main body, a projecting body, and multiple metal electrodes. The projecting body is mounted on a connecting end surface of the board main body and projects from the connecting end surface in an insertion direction of the connector. When the connector is connected to another device, the projecting body of the circuit board structure may push a part of pins of the device first, so the user may exert less force to insert the projecting body into the device. Then, when the circuit board structure is inserted further, the board main body may abut the remaining pins. Because part of the pins have been pushed away by the projecting body, the board main body only needs to counteract resistance from the remaining pins.

8 Claims, 11 Drawing Sheets

(56) References Cited

U.S. PATENT DOCUMENTS

| | | | | |
|---|---|---|---|---|
| 5,210,855 | A * | 5/1993 | Bartol | G06F 13/4081 710/107 |
| 5,236,372 | A * | 8/1993 | Yunoki | H05K 1/117 439/59 |
| 5,319,523 | A * | 6/1994 | Ganthier | H05K 1/117 361/753 |
| 5,772,448 | A * | 6/1998 | Ekrot | H05K 1/117 439/60 |
| 6,135,781 | A * | 10/2000 | Pope | H01R 24/60 439/59 |
| 6,295,209 | B1 * | 9/2001 | Farnworth | H01L 23/32 257/E23.078 |
| 6,425,766 | B1 * | 7/2002 | Panella | H05K 1/117 439/59 |
| 6,452,114 | B1 * | 9/2002 | Schweitzer | H05K 1/117 174/261 |
| 6,804,119 | B2 * | 10/2004 | Ziemkowski | H01R 13/6485 361/715 |
| 6,814,583 | B1 * | 11/2004 | Young | H01R 12/721 439/62 |
| 6,855,891 | B2 * | 2/2005 | Eguchi | H05K 1/117 174/250 |
| 6,896,523 | B2 * | 5/2005 | Nishizawa | G06K 19/07 439/60 |
| 6,994,563 | B2 * | 2/2006 | Amini | H05K 1/117 439/62 |
| 7,172,465 | B2 * | 2/2007 | Kinsley | H01R 12/58 439/632 |
| 7,255,586 | B2 * | 8/2007 | Okada | H01R 13/20 439/346 |
| 7,453,338 | B2 * | 11/2008 | Aronson | H01R 13/6585 333/260 |
| 7,547,213 | B2 * | 6/2009 | Pax | H05K 1/117 174/250 |
| 8,110,751 | B2 * | 2/2012 | Kim | H05K 1/117 174/261 |
| 8,337,243 | B2 * | 12/2012 | Elkhatib | H01R 12/62 439/581 |
| 8,371,860 | B2 * | 2/2013 | Xiang | H01R 13/193 439/60 |
| 8,708,710 | B2 * | 4/2014 | Law | H01R 13/04 439/60 |
| 8,951,048 | B2 * | 2/2015 | Seok | H05K 1/117 439/59 |
| 9,055,684 | B2 * | 6/2015 | Xie | H05K 1/117 |
| 9,147,979 | B1 * | 9/2015 | Chung | H01R 13/6594 |
| 9,433,094 | B2 * | 8/2016 | Kashiwakura | H05K 1/117 |
| 9,549,469 | B2 * | 1/2017 | Beaman | H05K 3/403 |
| 9,647,388 | B1 * | 5/2017 | Ray | H01R 13/6275 |
| 9,673,545 | B2 * | 6/2017 | Ishida | H01R 12/88 |
| 9,865,948 | B2 * | 1/2018 | Phillips | H01R 12/7005 |
| 10,199,754 | B2 * | 2/2019 | Ishimatsu | H01R 12/53 |
| 10,374,342 | B2 * | 8/2019 | Koh | H01R 13/245 |
| 10,804,629 | B2 * | 10/2020 | Shirk/Heath | H01R 12/721 |
| 10,879,634 | B1 * | 12/2020 | Liao | H01R 13/6587 |
| 11,043,247 | B2 * | 6/2021 | Han | G11C 5/063 |
| 2014/0138141 | A1 * | 5/2014 | Li | G06F 3/041 174/261 |
| 2020/0301617 | A1 * | 9/2020 | Kimura | H01R 12/724 |
| 2021/0249803 | A1 * | 8/2021 | Kojima | H01R 12/79 |
| 2021/0265782 | A1 * | 8/2021 | Wang | H01R 12/62 |

\* cited by examiner

CABLE END CONNECTOR

BACKGROUND OF THE INVENTION

1. Field of the Invention

The present invention relates to a component for transmitting signals, especially to a connector with a circuit board.

2. Description of the Prior Arts

With increase of efficacy of an electronic component and capacity of a storage component, lines connected to these components should have corresponding transmitting capacity. Thus, the components and lines may comprise more pins. The pins in a connector of the line have to tightly abut the pins of the electronic component or the storage component. Because each pin may provide the same resistance, the total resistance may be proportional to an amount of the pins. In other words, more pins generate higher resistance, and thus a user has to exert larger force to connect or disconnect.

A conventional connecting structure is as follows: a connector has a circuit board 91 therein and the circuit board 91 has multiple metal electrodes (a.k.a. gold fingers) as pins, and an electronic component has multiple pins 92, so that the metal electrodes of the circuit board 91 can be connected to the pins 92 of the electronic component. When connecting the connector and the electronic component, the circuit board 91 has to push the pins 92 away and then the circuit board 91 can be inserted into the electronic component, which connects the metal electrodes with the pins 92. Because the conventional component only has a few pins, during insertion of the circuit board 91, the user may sense a condition of the pins 92 and thereby adjust an insertion direction of the circuit board 91. However, because a current component has more pins 92, the user may hardly sense conditions of the pins 92 but can only force the circuit board 91 to move into the electronic component in a wrong direction. Therefore, the user may deform the pins 92 or push the pins 92 to depart from original sites and move into the electronic component further, which makes the electronic component unable to be electrically connected to the connector and need repair or replacement.

To overcome the shortcomings, the present invention provides a circuit board structure and a connector comprising the same to mitigate or obviate the aforementioned problems.

SUMMARY OF THE INVENTION

The main objective of the present invention is to provide a cable end connector that is capable of fixing an end of a cable and can be inserted into another device in several stages under less force, so the force may not deform pins of the device or make the pins detach from the device.

The cable end connector has a casing, a circuit board, and a plurality of electrodes. The casing has a through hole and two lateral guiding arms. The circuit board penetrates through the through hole and forms two gaps between the circuit board and the two lateral guiding arms. The circuit board has a top surface, a bottom surface, and a front surface. The circuit board has two protrusion portions formed on the front surface. Both of the two protrusion portions extends forward from the front surface and is symmetry to a first imaginary symmetry line in location. The first imaginary symmetry line extends along a forward-backward direction. Each of the two protrusion portions is symmetry to a second imaginary symmetry line in shape, and the second imaginary symmetry lines respectively pass through a center of said protrusion portion and extend along the forward-backward direction. The electrodes are parallelly arranged on the top surface and the bottom surface of the circuit board. The electrodes include four grounding electrodes. Two of the grounding electrodes located on the top surface and two of the grounding electrodes located on the bottom surface. The grounding electrodes has identical length and overlaps with the second imaginary symmetry lines of the two protrusion portions. The four grounding electrodes are the longest electrodes in the electrodes.

As a result, in the beginning of connecting the connector to another device, the at least one projecting body of the circuit board structure may abut a part of pins of a device but the board main body of the circuit board structure may not abut the remaining pins of the device. When abutting the pins of the device, the at least one projecting body may push the abutted pins away. In other words, the user only has to push part of the pins so the user may exert less force to counteract a resistance of the pins. After the user pushes the connector and thus the circuit board structure is inserted into the electronic device further, the board main body may abut the remaining pins. Because part of the pins have been pushed away by the projecting bodies, the board main body only has to counteract the resistance from the remaining pins. With the aforesaid process which inserts the circuit board structure into the electronic device in multiple stages, the user can use less force in every stage. As a result, when the insertion direction of the connector is incorrect, the user can feel conditions of the pins rather than uses larger force to deform the pins or push the pins to depart from original sites and move into the electronic component further.

Other objectives, advantages and novel features of the invention will become more apparent from the following detailed description when taken in conjunction with the accompanying drawings.

DETAILED DESCRIPTION OF THE PREFERRED EMBODIMENTS

Figure 1:
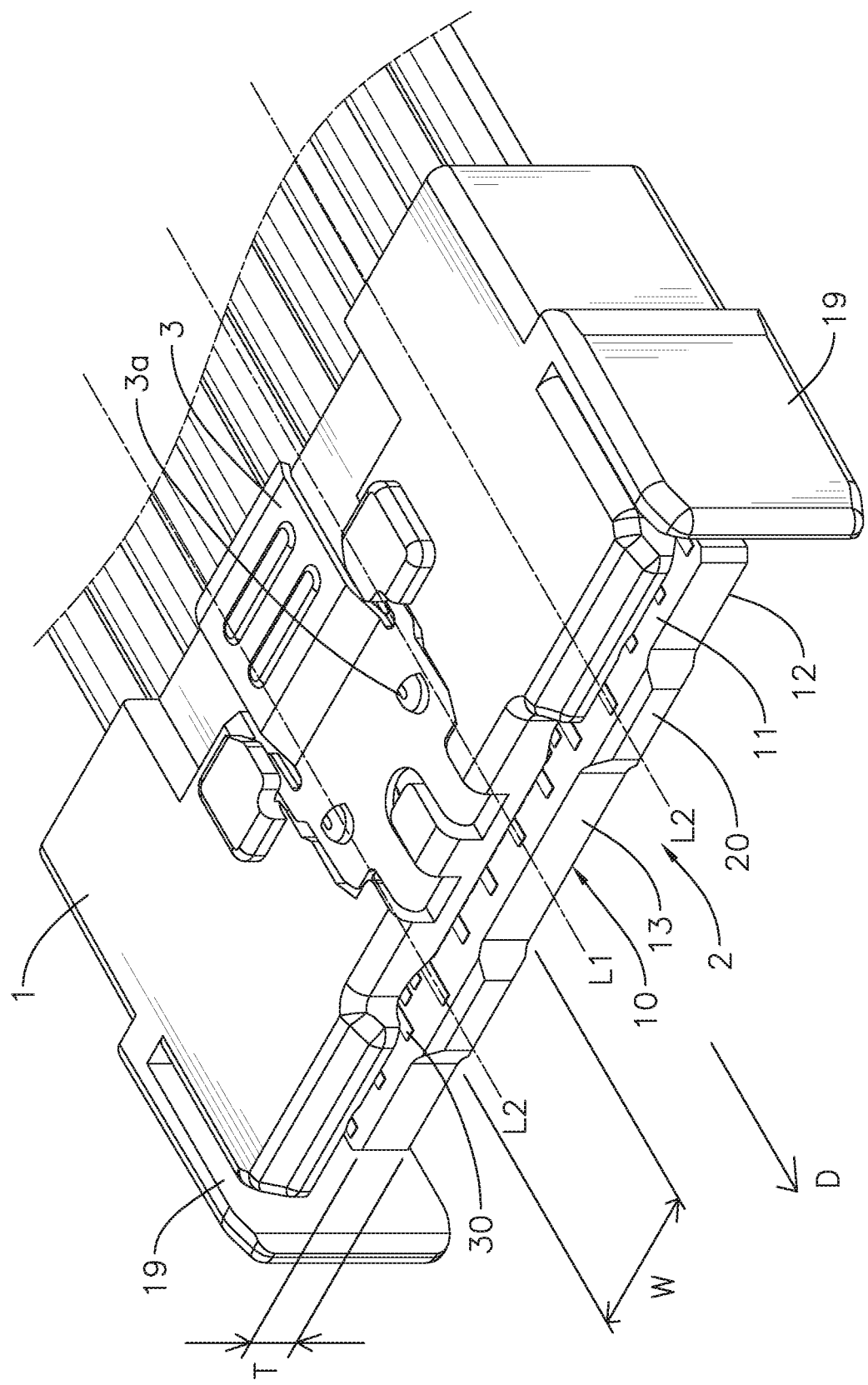
FIG. 1 is a perspective view of a connector and a circuit board structure in the connector in accordance with the present invention.
Figure 2:
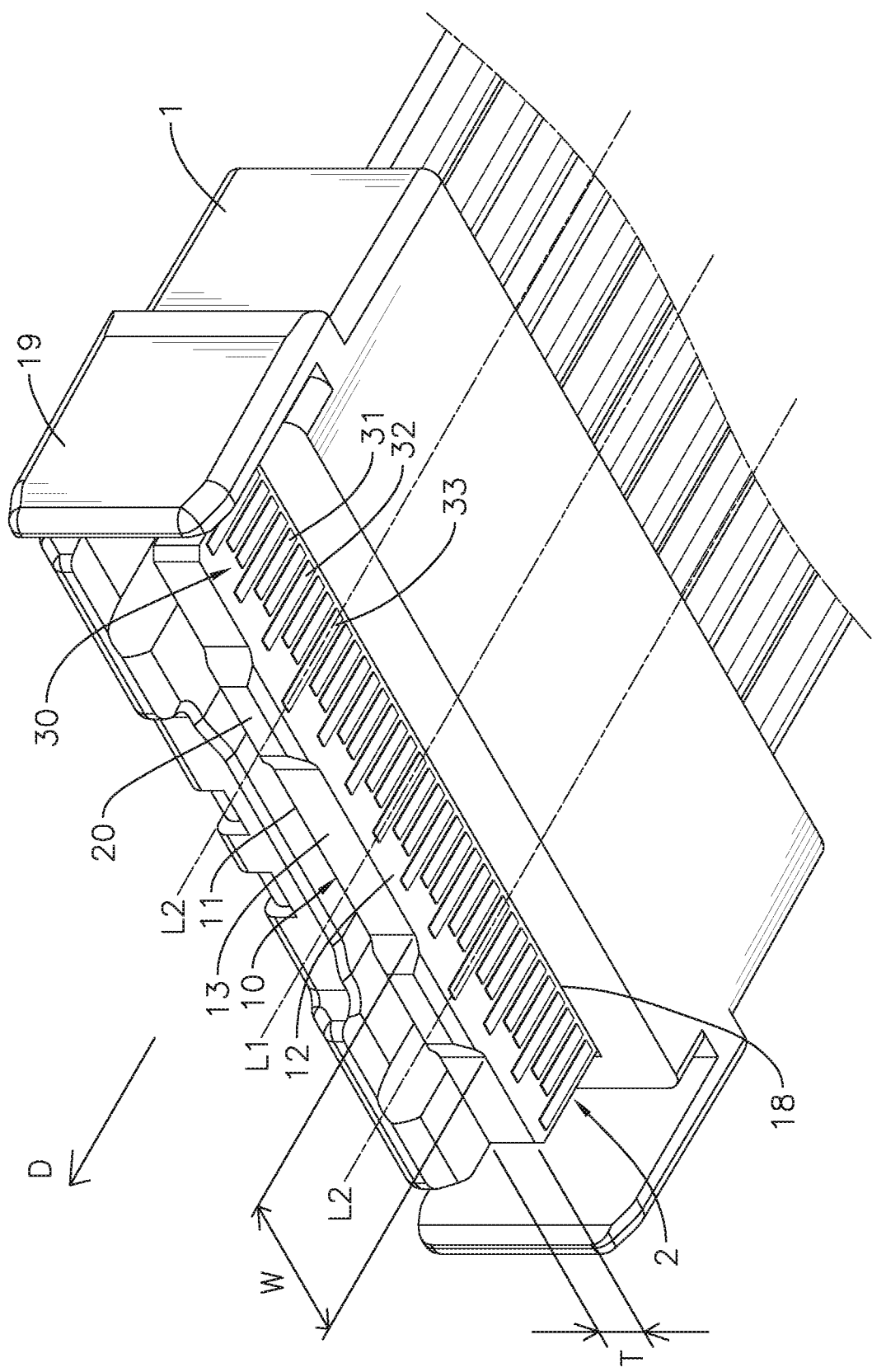
FIG. 2 is another perspective view of the connector and the circuit board structure in FIG. 1.
Figure 3:
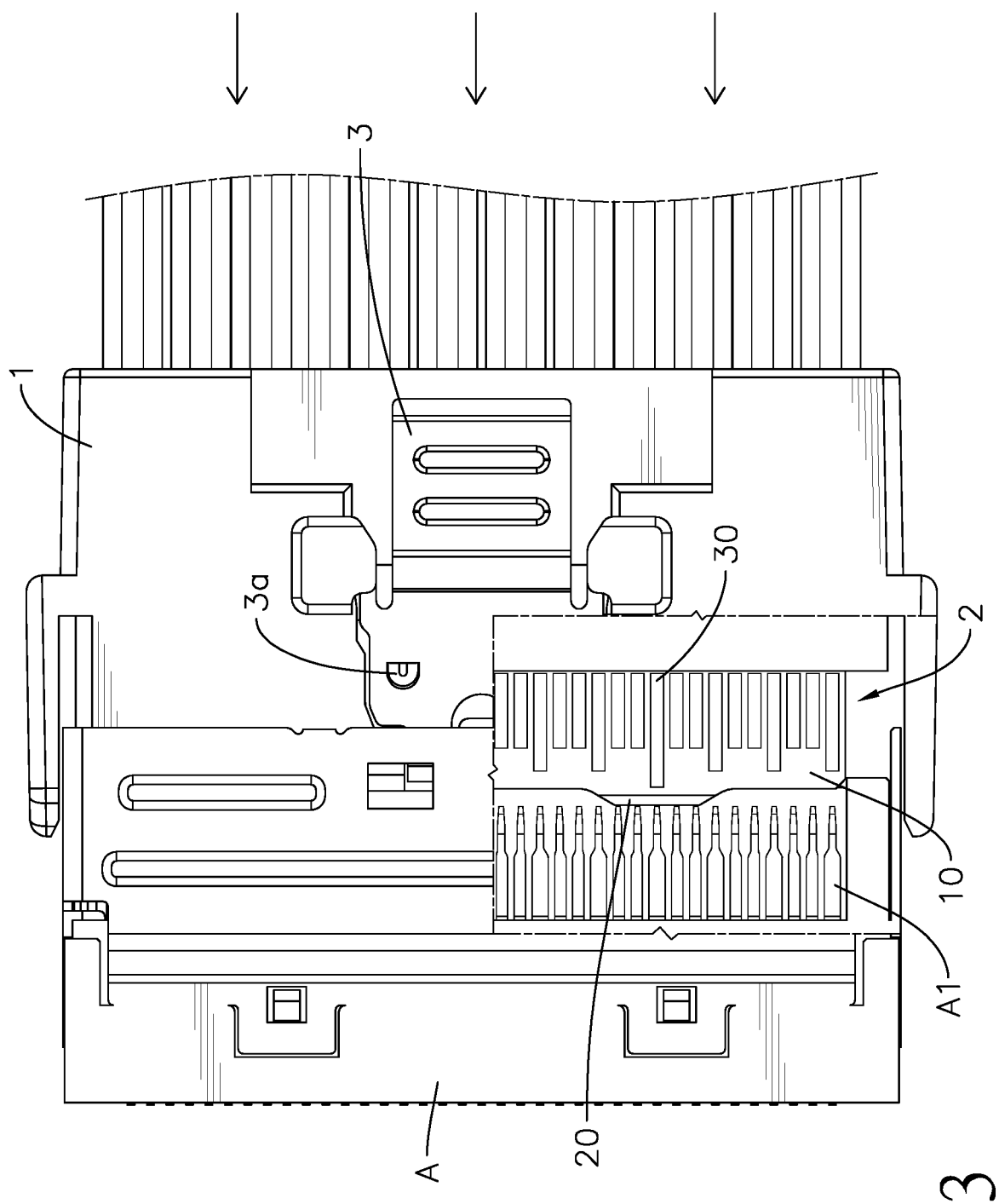
FIG. 3 is a perspective view of the connector in FIG. 1 showing the connector preliminarily inserted into an electronic device.
Figure 4:
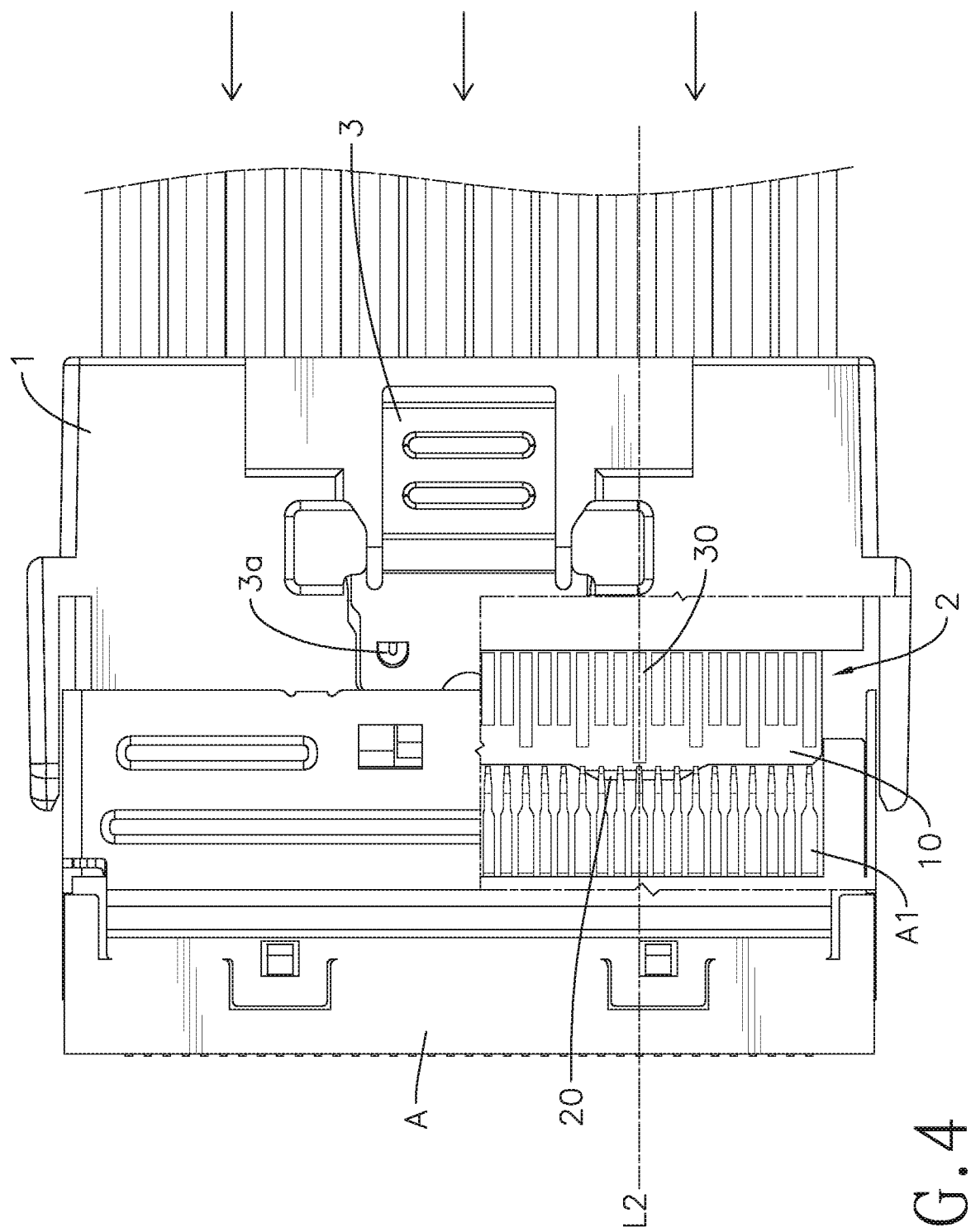
FIG. 4 is a perspective view of the connector in FIG. 3, showing the connector further inserted into the electronic device.

With reference to FIG. 1 and FIG. 2, a connector in accordance with the present invention is provided and comprises a casing 1 and a circuit board structure 2 (i.e., a circuit board); the connector selectively comprises a resilient latch 3. The connector has an insertion direction D which is a moving direction (i.e. forward-backward direction) during insertion of the connector into an electronic device. The casing 1 has a through hole 18 and two lateral guiding arms 19.

The circuit board structure 2 is mounted through the casing 1 and comprises a board main body 10, at least one projecting body 20 (i.e. the protrusion portion), and a plurality of metal electrodes 30. The board main body 10 may include a first board surface 11 (e.g., a top surface), a second board surface 12 (e.g., a bottom surface), and a connecting end surface 13 (i.e., a front surface). The first board surface 11 and the second board surface 12 are two surfaces of the board main body 10 opposite each other and the first board surface 11 and the second board surface 12 are parallel with each other. The connecting end surface 13 connects the first board surface 11 and the second board surface 12 and is perpendicular to the first board surface 11 and the second board surface 12. A normal direction of the connecting end surface 13 is parallel with the insertion direction D of the connector.

The at least one projecting body 20 is mounted on the connecting end surface 13 of the board main body 10 and projects from the connecting end surface 13 in a direction parallel with the first board surface 11. In other words, a projecting direction of the at least one projecting body 20 is parallel with the insertion direction D of the connector. In this embodiment, in a direction away from the board main body 10, both of a thickness T and a width W of each one of the at least one projecting body 20 taper from the connecting end surface 13. In other words, the thickness T and the width W of each projecting body 20 taper in the insertion direction D. The thickness T and the width W are perpendicular to each other, and both the thickness T and the width W are perpendicular to the insertion direction D. Besides, the width W is parallel with the first board surface 11.

The metal electrodes 30 (a.k.a. gold fingers or electrodes) may be mounted on the first board surface 11 and the second board surface 12, but, in this embodiment, a part of the metal electrodes 30 is mounted on the first board surface 11 and another part of the metal electrodes 30 is mounted on the second board surface 12. The metal electrodes 30 have different lengths, so the distances between the metal electrodes 30 and the connecting end surface 13 are different.

In this embodiment, the metal electrodes 30 may include at least one first length metal electrode 31, at least one second length metal electrode 32, and at least one third length metal electrode 33 (i.e. grounding electrode). A length of each one of the at least one first length metal electrode 31 and a length of each one of the at least one second length metal electrode 32 are different; precisely the length of each first length metal electrode 31 is smaller than that of each second length metal electrode 32. A length of each one of the at least one third length metal electrode 33 is larger than the lengths of both the first length metal electrode 31 and the second length metal electrode 32. In other words, a distance between each third length metal electrode 33 and the connecting end surface 13 is smaller than a distance between each second length metal electrode 32 and the connecting end surface 13, and the distance between each second length metal electrode 32 and the connecting end surface 13 is smaller than a distance between each first length metal electrode 31 and the connecting end surface 13. In this embodiment, at least one of the metal electrodes 30 further extends to one of the at least one projecting body 20 from the first board surface 11 and the second board surface 12; for example, the at least one third length metal electrode 33 may extend to the at least one projecting body 20.

In this embodiment, the at least one third length metal electrode 33, i.e. the longest among the metal electrodes 30, is grounded first, which protects electronic components on the circuit board structure 2 when the circuit board structure 2 is connected to a device. Then, the at least one second length metal electrode 32, i.e. the second longest among the metal electrodes 30, may be connected to a power and the at least one first length metal electrode 31, i.e. the shortest among the metal electrodes 30, may be connected to signal sources, so the circuit board structure 2 is powered and turned on first, which decreases a waiting time for the circuit board structure 2 to work. In another embodiment, the length and the function of each metal electrode 30 are not limited thereto, which may have different configurations according to a connected device.

Then with reference to FIG. 3 to FIG. 6, a connecting system comprising the aforesaid connector and an electronic device A is shown. The electronic device A comprises a plurality of pins A1. With the aforesaid circuit board structure 2, when the connector is connected to the electronic device A, the projecting bodies 20 of the circuit board structure 2 may abut a part of the pins A1 of the electronic device A, but the board main body 10 still does not contact the remaining pins A1. When abutting the part of pins A1 of the electronic device A, the projecting bodies 20 will push away the abutted pins A1. In other words, the projecting bodies 20 can be inserted into the electronic device A after part of the pins A1 are pushed away, so a user can exert less force to counteract the resistance from the pins A1. After the user pushes the connector and thus the circuit board structure 2 is inserted into the electronic device A further, the board main body 10 may abut the remaining pins A1. Because part of the pins A1 have been pushed away by the projecting bodies 20, the board main body 10 only has to counteract the resistance from the remaining pins A1. With the aforesaid process which inserts the circuit board structure 2 into the electronic device A in multiple stages, the user can use less force in every stage. As a result, when the insertion direction of the connector is incorrect, the user can feel conditions of the pins A1 rather than uses larger force to deform the pins A1 or pushes the pins A1 into the electronic device A.

Figure 5:
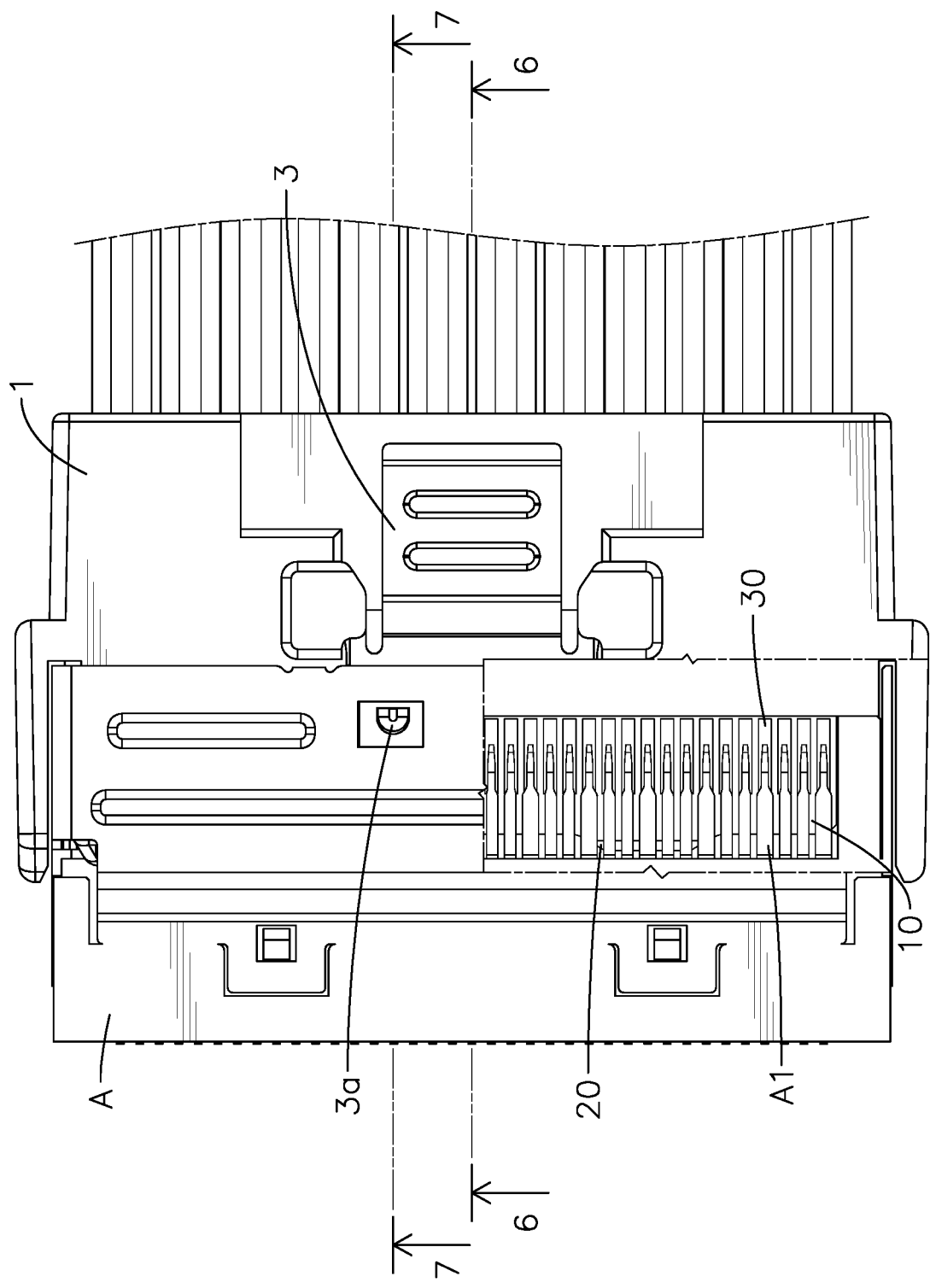
FIG. 5 is a perspective view of the connector in FIG. 3, showing the connector completely inserted into the electronic device.
Figure 6:
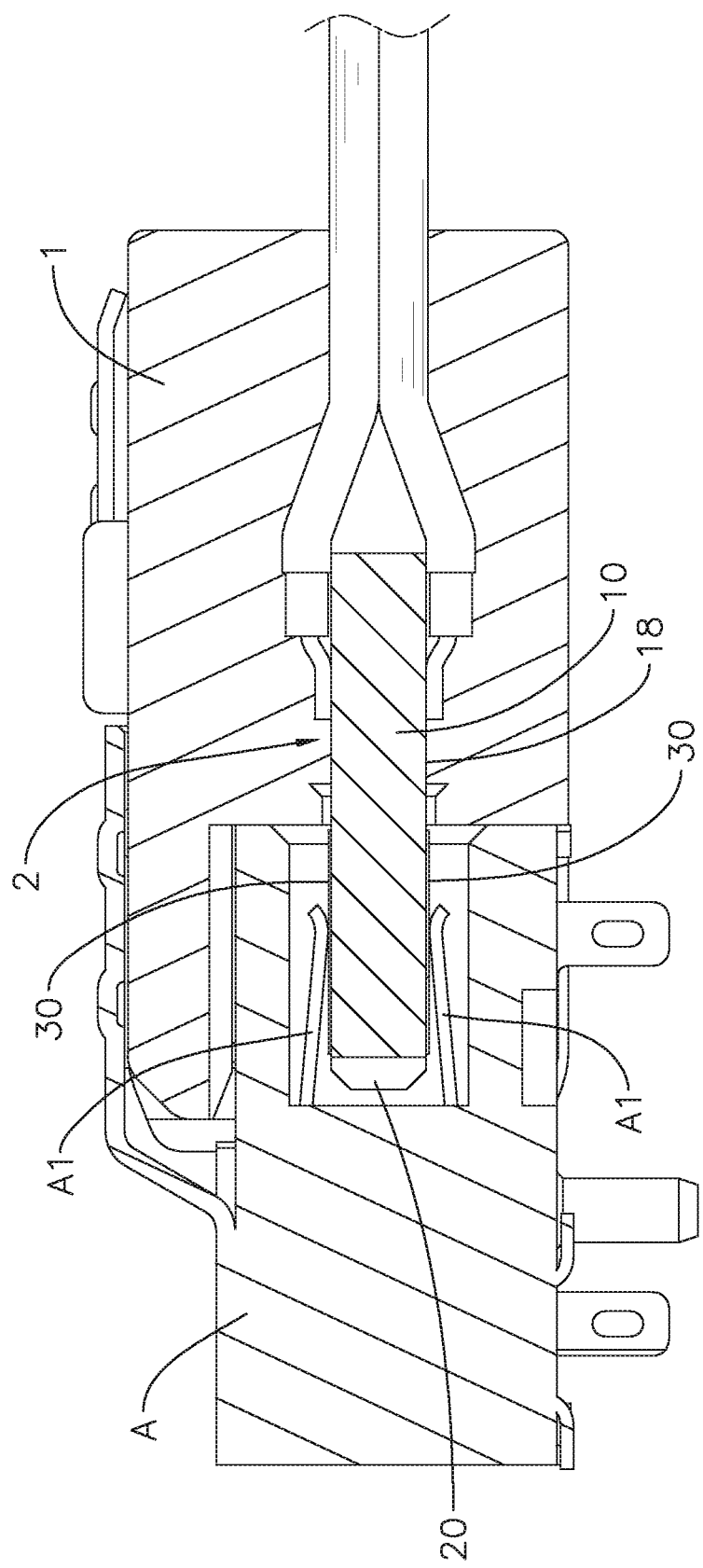
FIG. 6 is a sectional view of the connector and the electronic device along line 6-6 in FIG. 5.
Figure 7:
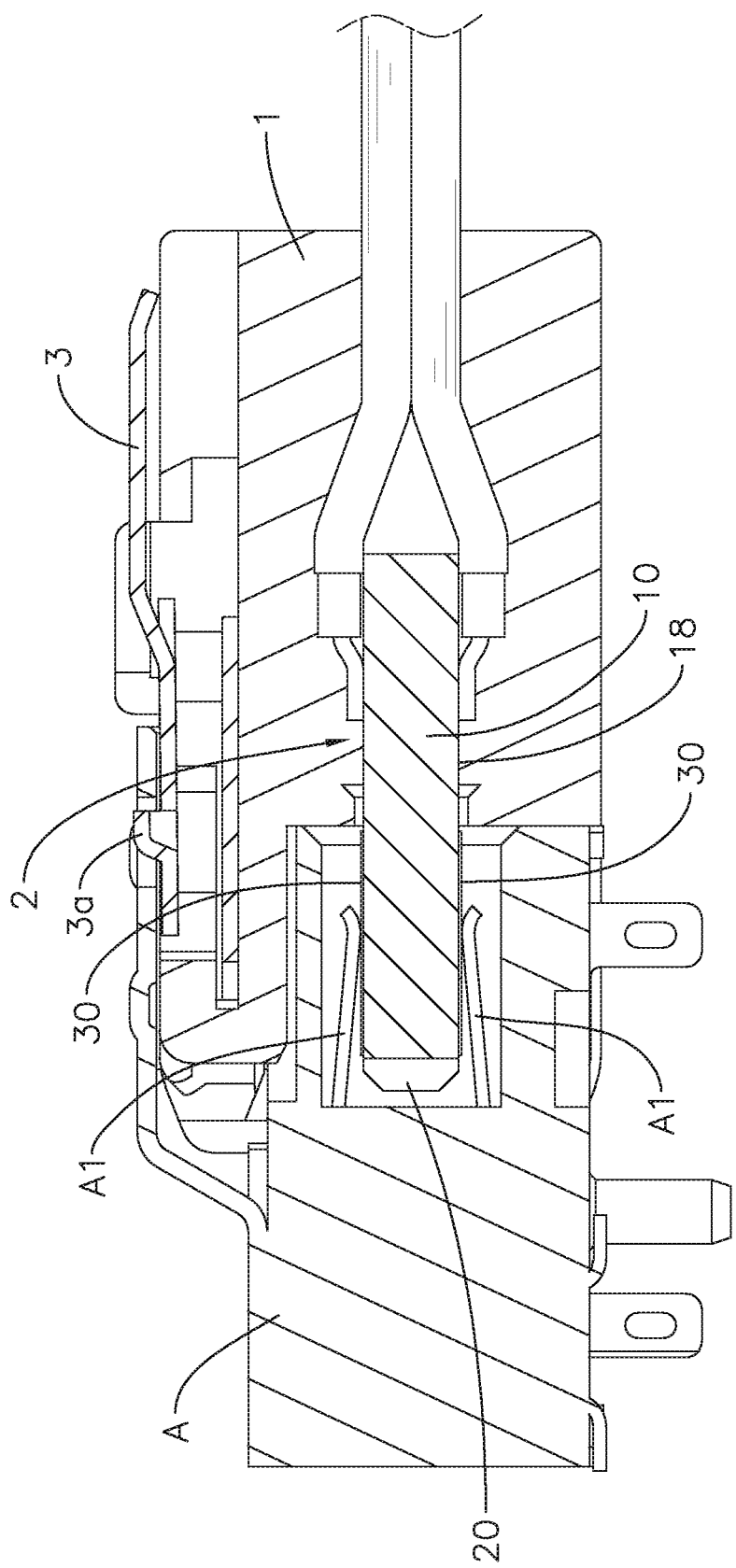
FIG. 7 is a sectional view of the connector and the electronic device along line 7-7 in FIG. 5.

Then please refer to FIG. 5 and FIG. 7. The resilient latch 3 is securely mounted on the casing 1 and comprises at least one protrusion 3a. When the connector is mounted on the electronic device A, the at least one protrusion 3a of the resilient latch 3 may engage the electronic device A, and thereby the connector will not be detached from the electronic device A. To detach the connector from the electronic device A, the user may just press the resilient latch 3, thereby separating the protrusion 3a from the electronic device A, so the connector can be pulled out of the electronic device A.

Figure 8:
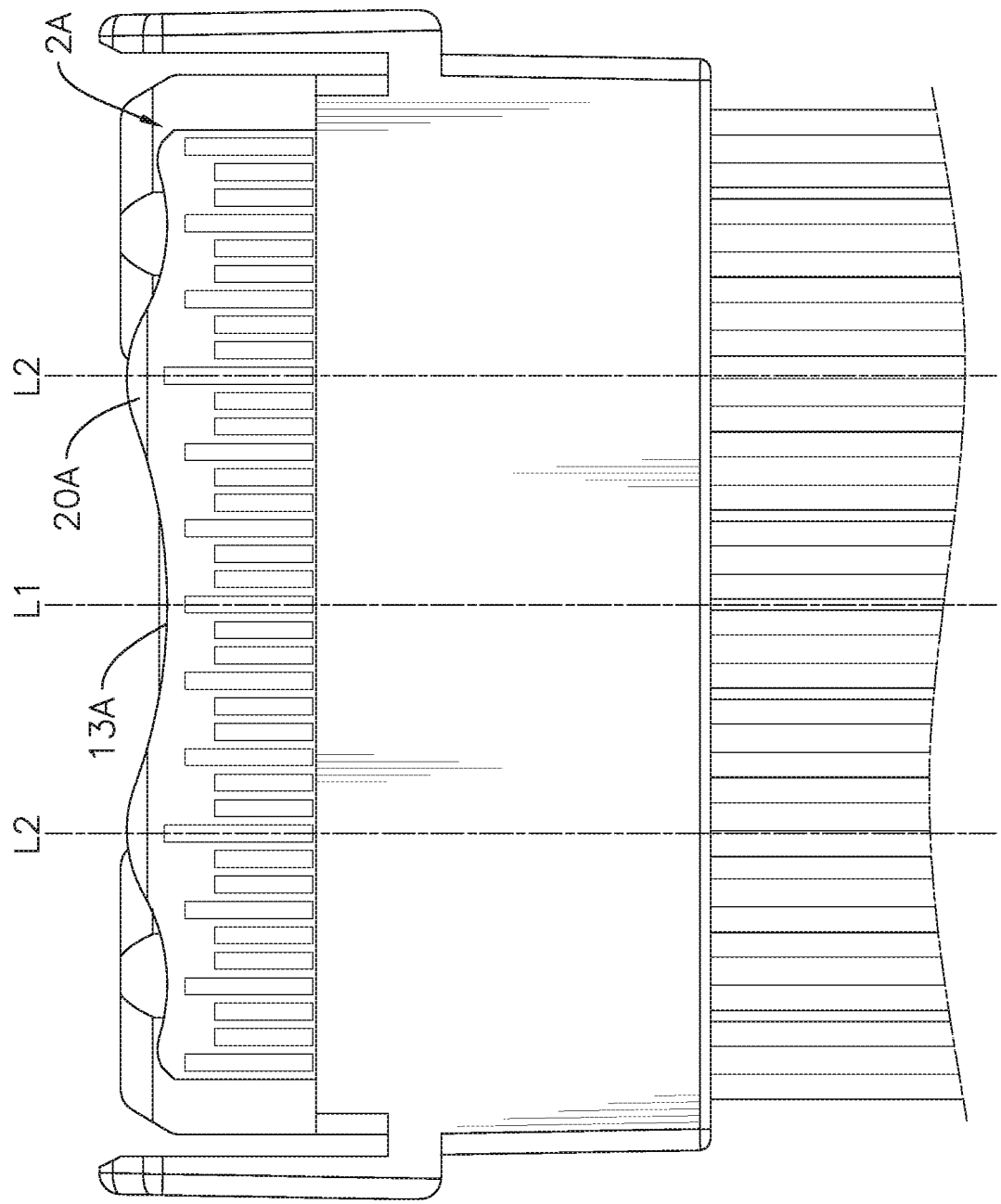
FIG. 8 is a bottom view of the connector in accordance with another embodiment of the present invention.

Then please refer to FIG. 8. In another embodiment, in the insertion direction D, a front edge of the circuit board structure 2A may form at least one curved edge or a wavy edge. In this embodiment, the connecting end surface 13A and the projecting body 20A of the circuit board structure 2 may form at least one inward curved surface and at least one outward curved surface, but it is not limited thereto. For example, the curved surfaces on the connecting end surface 13A are curved inward and the curved surfaces on the projecting bodies 20A are curved outward, and the curved surfaces on the connecting end surface 13A and the curved surfaces on the projecting bodies 20A are connected in a staggered way. Therefore, a wavy edge of the circuit board structure 2A is formed from the connecting end surface 13A and the projecting bodies 20A, so the resistance can be distributed over the multiple-stage inserting process.

Figure 9:
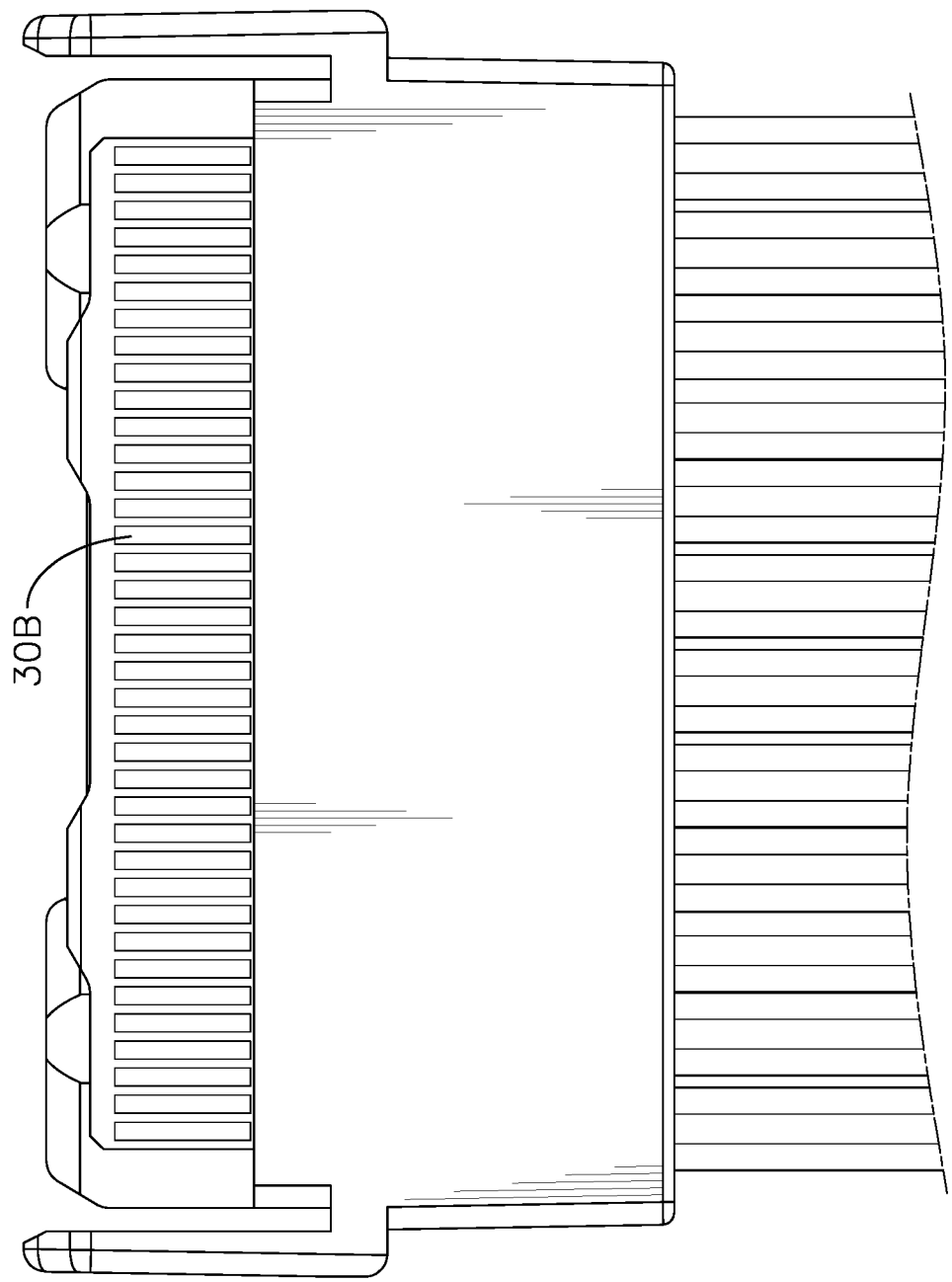
FIG. 9 is a bottom view of the connector in accordance with still another embodiment of the present invention.
Figure 10:
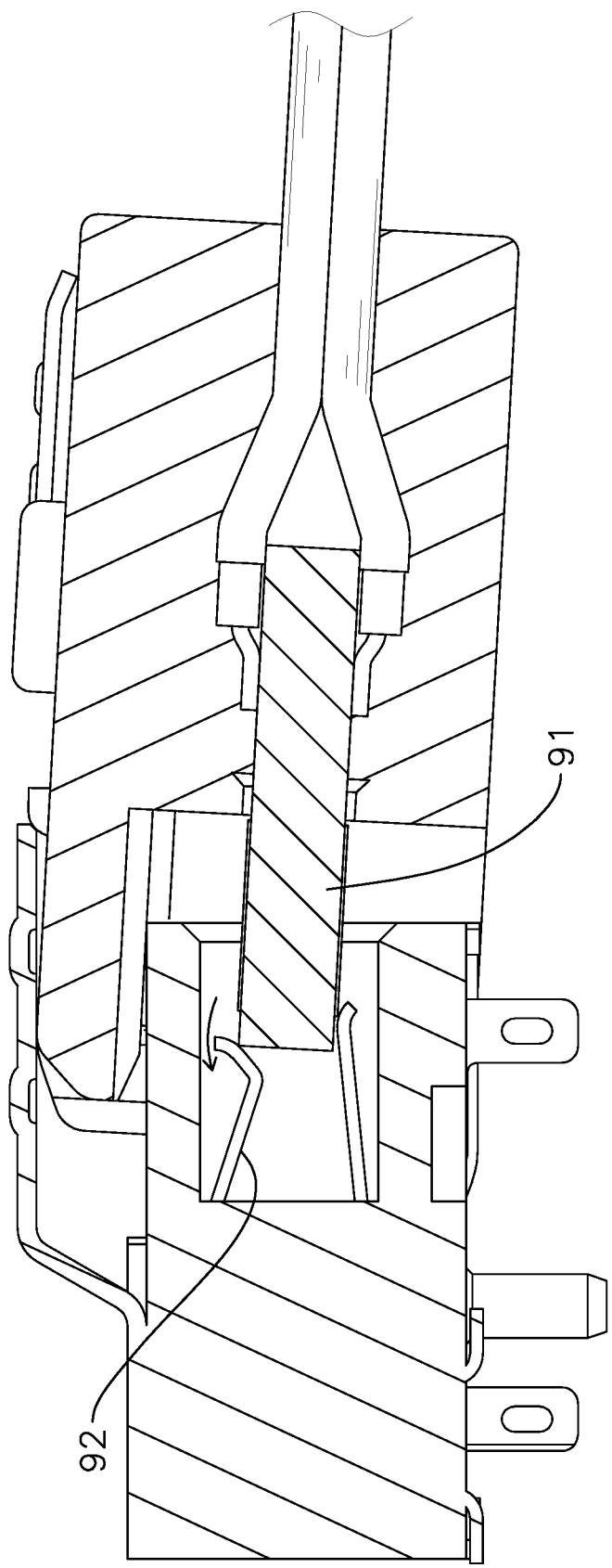
FIG. 10 is a perspective view of a conventional connector, showing a circuit board of the conventional connector deforming pins of an electronic device when the conventional connector is being mounted on the electronic device.
Figure 11:
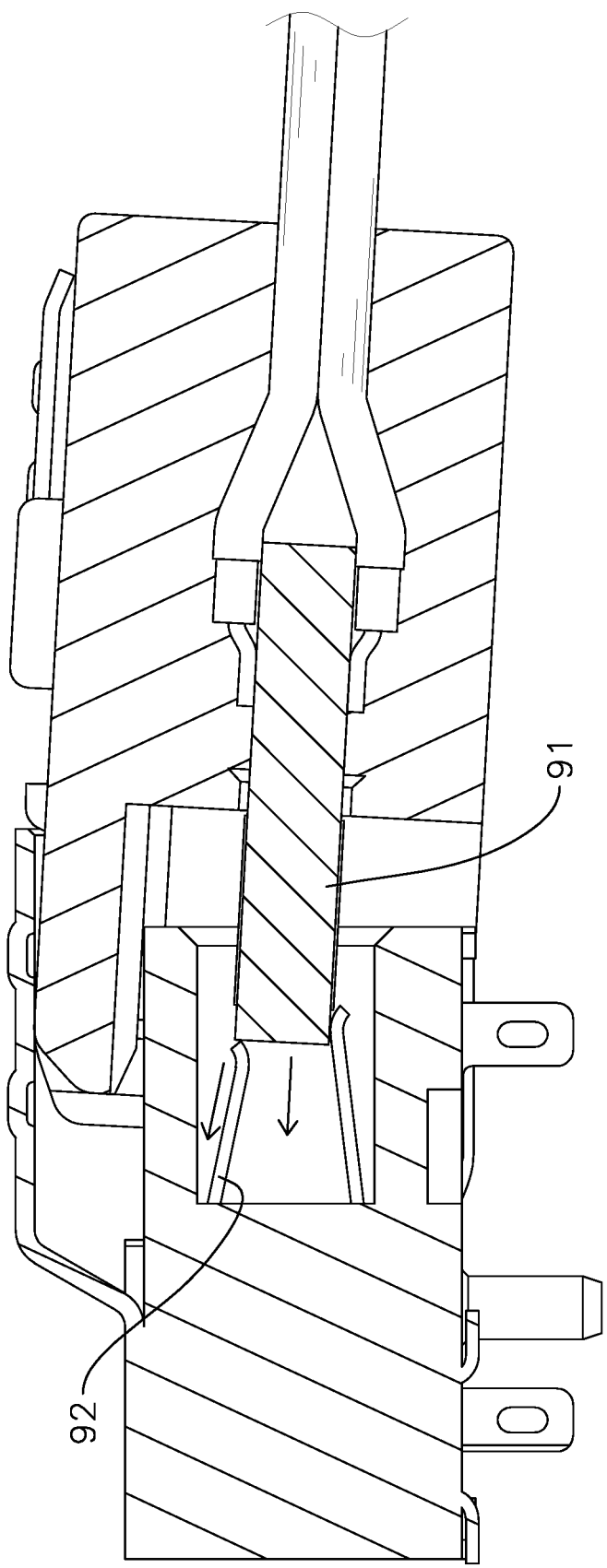
FIG. 11 is a perspective view of a conventional connector, showing a circuit board of the conventional connector detaching pins from an electronic device when the conventional connector is being mounted on the electronic device.

Then please refer to FIG. 9. In another embodiment, the lengths of the metal electrodes 30B may be equal, which also can achieve the same advantages in the aforesaid embodiments.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A cable end connector, capable of fixing a cable at an end thereof, the cable end connector comprising:
    a casing, having a through hole and two lateral guiding arms;
    a circuit board, penetrating through the through hole and forming two gaps between the circuit board and the two lateral guiding arms, the circuit board including:
        a top surface,
        a bottom surface, and
        a front surface, the circuit board having two protrusion portions formed on the front surface, both of the two protrusion portions extending forward from the front surface and being symmetric with respect to a first imaginary symmetry line in location, the first imaginary symmetry line extending along a forward-backward direction, each of the two protrusion portions being symmetric with respect to a second imaginary symmetry line in shape, the second imaginary symmetry line passing through a center of said protrusion portion and extending along the forward-backward direction; and
    a plurality of electrodes, parallelly arranged on the top surface and the bottom surface of the circuit board, the electrodes including four grounding electrodes, two of the four grounding electrodes being located on the top surface and two of the four grounding electrodes being located on the bottom surface, the grounding electrodes having an identical length, each of the grounding electrodes overlapping with the second imaginary symmetry lines of the two protrusion portions, the four grounding electrodes being longest electrodes among the plurality of electrodes.

2. The cable end connector as claimed in claim 1, wherein at least one of the electrodes extends from the first board surface to the protrusion portions.

3. The cable end connector as claimed in claim 1, wherein in a forward-backward direction, a thickness of each one of the protrusion portions tapers from the front surface.

4. The cable end connector as claimed in claim 1, wherein in a forward-backward direction, a width of each one of the protrusion portions tapers from the front surface.

5. The cable end connector as claimed in claim 1, wherein the front surface and the protrusion portions form a wavy edge together.

6. The cable end connector as claimed in claim 1, wherein the electrodes include:
    at least one first length electrode and at least one second length electrode; a length of each one of the at least one first length electrode being different from a length of each one of the at least one second length electrode.

7. The cable end connector as claimed in claim 6, wherein
    a length of each one of the grounding electrodes is larger than the length of each one of the at least one first length electrode; and
    the length of each one of the grounding electrodes is larger than the length of each one of the at least one second length electrode.

8. The cable end connector as claimed in claim 1, wherein the cable end connector is configured to be inserted into an electronic device comprises:
    a resilient latch securely mounted on the casing and comprising:
    at least one protrusion selectively engaging with the electronic device.

* * * * *